United States Patent
Kato

(10) Patent No.: US 9,157,934 B2
(45) Date of Patent: Oct. 13, 2015

(54) TEST APPARATUS

(71) Applicant: ADVANTEST CORPORATION, Tokyo (JP)

(72) Inventor: Takashi Kato, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 273 days.

(21) Appl. No.: 13/851,960

(22) Filed: Mar. 28, 2013

(65) Prior Publication Data

US 2013/0335101 A1 Dec. 19, 2013

(30) Foreign Application Priority Data

Jun. 19, 2012 (JP) .................... 2012-137685

(51) Int. Cl.
*G01R 31/02* (2006.01)
*G01R 1/20* (2006.01)
*G01R 31/3193* (2006.01)

(52) U.S. Cl.
CPC .......... *G01R 1/206* (2013.01); *G01R 31/31932* (2013.01)

(58) Field of Classification Search
CPC .................. G01R 31/31725; G01R 31/31937; G01R 31/31932; G01R 31/3193; G01R 31/31703; G01R 31/28; G01R 31/317
USPC .............. 324/537, 762.01, 765, 750.01, 532; 702/70, 66, 69, 82; 714/724, 733, 734, 714/742
See application file for complete search history.

(56) References Cited

U.S. PATENT DOCUMENTS

| | | | |
|---|---|---|---|
| 3,772,595 A * | 11/1973 | De Wolf et al. | 714/736 |
| 5,144,626 A * | 9/1992 | Funatsu et al. | 370/526 |
| 7,408,337 B2 * | 8/2008 | Persons | 324/750.01 |
| 8,275,569 B2 * | 9/2012 | Horiguchi | 702/120 |
| 2004/0239373 A1 * | 12/2004 | Seshita | 327/65 |
| 2009/0134851 A1 * | 5/2009 | Takeda et al. | 323/234 |
| 2009/0141825 A1 * | 6/2009 | Jacobsson et al. | 375/294 |
| 2010/0148826 A1 * | 6/2010 | Kojima | 327/80 |

FOREIGN PATENT DOCUMENTS

| | | |
|---|---|---|
| JP | 3464478 B2 | 11/2003 |
| JP | 2006-500580 A | 1/2006 |

OTHER PUBLICATIONS

Notice of Office Action for Korean Patent Application No. 10-2013-0057595, issued by the Korean Intellectual Property Office on May 28, 2014.

* cited by examiner

*Primary Examiner* — Huy Q Phan
*Assistant Examiner* — Thang Le

(57) ABSTRACT

A test apparatus for testing a device under test, includes a low-speed comparator, a high-speed comparator that is operable faster than the low-speed comparator, and a switching section that switches, according to a signal output from the device under test, which one of the low-speed comparator and the high-speed comparator is used to measure a signal under measurement output from the device under test. The test apparatus may further include a termination resistance that is arranged in parallel with the high-speed comparator.

8 Claims, 5 Drawing Sheets

TEST APPARATUS

BACKGROUND

1. Technical Field

The present invention relates to a test apparatus.

2. Related Art

In the conventional art, a known test apparatus for testing a device under test includes a high-speed comparator used to measure a high-speed test pin of the device under test as disclosed in, for example, Japanese Patent Application Publication No. 2006-500580.

Particular standards such as MIPI require that a signal be transmitted which dynamically switches between a high-speed mode and a low-speed mode. Thus, a test apparatus is required to be able to receive high-speed-mode and low-speed-mode signals in order to test devices compatible with such standards.

SUMMARY

Therefore, it is an object of an aspect of the innovations herein to provide a test apparatus, which is capable of overcoming the above drawbacks accompanying the related art. The above and other objects can be achieved by combinations described in the claims. A first aspect of the innovations may include a test apparatus for testing a device under test, includes a low-speed comparator, a high-speed comparator that is operable faster than the low-speed comparator, and a switching section that switches, according to a signal output from the device under test, which one of the low-speed comparator and the high-speed comparator is used to measure a signal under measurement output from the device under test.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
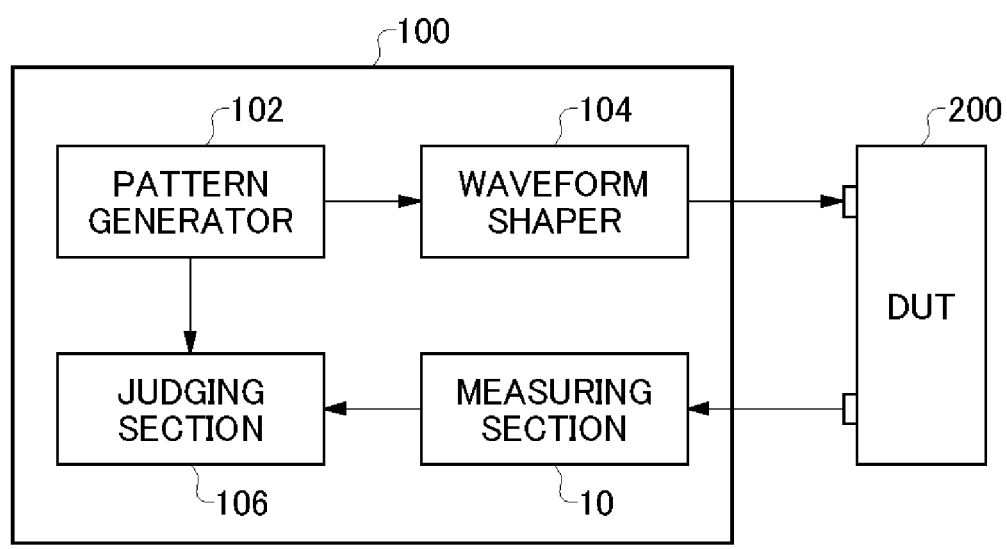
FIG. 1 schematically illustrates a test apparatus 100 that is configured to test a device under test 200.

FIG. 1 schematically illustrates a test apparatus 100 that is configured to test a device under test 200. The test apparatus 100 is configured to test the device under test 200 such as a semiconductor integrated circuit or the like. The device under test 200 dynamically switches between a high-speed mode and a low-speed mode and outputs a signal having a frequency determined according to the mode. Here, the expression "to dynamically switching" indicates that the mode of the device under test 200 switches while the device under test 200 is outputting the signal. The test apparatus 100 according to the present exemplary embodiment includes a pattern generator 102, a waveform shaper 104, a measuring section 10 and a judging section 106.

The pattern generator 102 generates a test pattern according to a test program supplied thereto from a user and the like. The test pattern includes a logic pattern a test signal input into the device under test 200 is expected to have, an expected value pattern a signal under measurement output from the device under test 200 is expected to have and other patterns. The waveform shaper 104 shapes the waveform of the test signal based on the test pattern output from the pattern generator 102. For example, the waveform shaper 104 outputs a voltage according to the logic value of the test signal in each cycle.

The measuring section 10 measures the signal under measurement output from the device under test 200 in response to the test signal. The measuring section 10 according to the present exemplary embodiment detects the logic pattern of the signal under measurement by comparing the voltage of the signal under measurement against a predetermined reference voltage. For example, the measuring section 10 outputs a binary signal indicative of whether the voltage of the signal under measurement is higher than the predetermined reference voltage. The measuring section 10 may sample the binary signal at predetermined timings to generate the logic pattern of the signal under measurement.

The judging section 106 compares the logic pattern generated by the measuring section 10 against the expected value pattern. The pattern generator 102 may generate the expected value pattern based on the logic pattern of the test signal. In the above-described manner, the test apparatus 100 can test the device under test 200.

Figure 2:
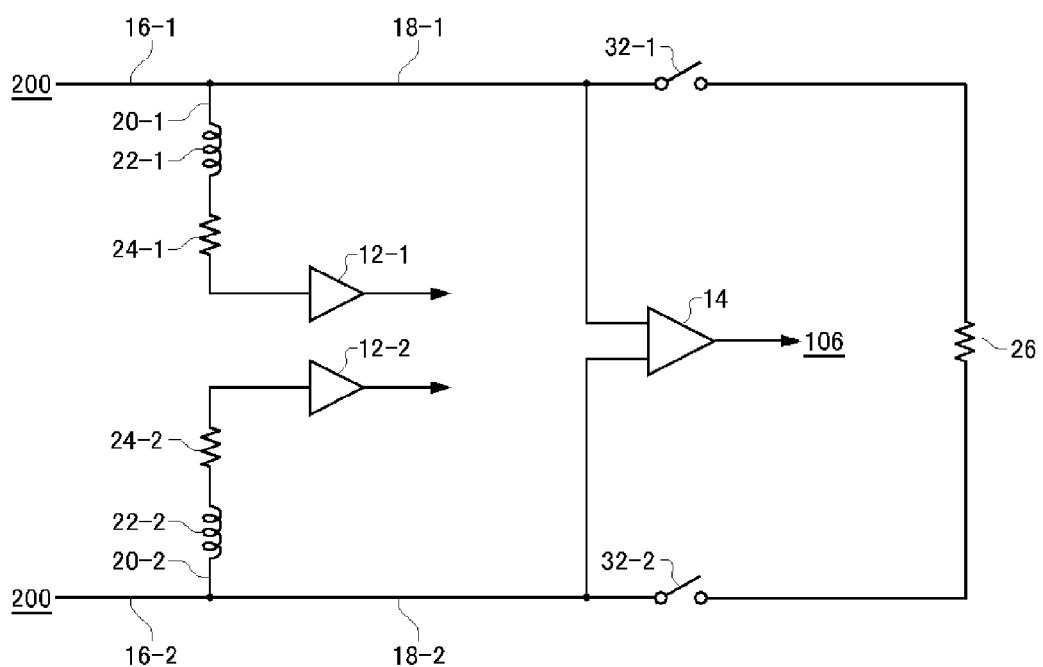
FIG. 2 illustrates an exemplary configuration of a measuring section 10.

FIG. 2 illustrates an exemplary configuration of the measuring section 10. The measuring section 10 according to the present exemplary embodiment includes two low-speed comparators 12-1 and 12-2 (generally referred to as "the low-speed comparators 12"), a high-speed comparator 14, two switching sections 32-1 and 32-2 (generally referred to as "the switching sections 32"), a termination resistance 26, two common transmission paths 16-1 and 16-2 (generally referred to as "the common transmission paths 16"), two high-speed transmission paths 18-1 and 18-2 (generally referred to as "the high-speed transmission paths 18"), two low-speed transmission paths 20-1 and 20-2 (generally referred to as "the low-speed transmission paths 20"), two inductance components 22-1 and 22-2 (generally referred to as "the inductance components 22"), and two resistance components 24-1 and 24-2 (generally referred to as "the resistance components 24").

The common transmission paths 16 are each connected at a first end thereof to the output pin of the device under test 200 and configured to transmit the signal under measurement. The first ends of the two common transmission paths 16 are connected to a pair of output pins of the device under test 200. The output pints forming a pair may be configured to output a differential signal when the device under test 200 operates in the high-speed mode and to output two single-ended signals when the device under test 200 operates in the low-speed mode.

Each of the low-speed transmission paths 20 is configured to transmit, to a corresponding one of the low-speed comparators 12, the signal under measurement that has been transmitted through a corresponding one of the common transmission paths 16. The low-speed transmission paths 20, which are positioned between the common transmission paths 16 and the low-speed comparators 12, each include an inductance component 22 and a resistance component 24. The inductance components 22 and the resistance components 24 may include components parasitic in the transmission path and may include components of resistors or the like provided on the transmission path.

Each of the low-speed comparators 12 compares the signal level of the signal under measurement received from the corresponding low-speed transmission path 20 against a predetermined reference voltage. Each of the low-speed comparators 12 outputs the logic pattern of the signal under measurement by outputting a digital signal according to the result of the comparison.

Each of the high-speed transmission paths 18 inputs, into the shared high-speed comparator 14, the signal under measurement that has been transmitted through a corresponding one of the common transmission paths 16. The high-speed transmission paths 18 may be connected to the differential inputs of the high-speed comparator 14. Each of the high-speed transmission paths 18 and a corresponding one of the low-speed transmission paths 20 branch from a corresponding one of the common transmission paths 16.

The high-speed comparator 14 is capable of operating faster than the low-speed comparators 12. For example, the high-speed comparator 14 can convert, into a binary or multi-valued signal, a signal under measurement that has a higher frequency than the maximum frequency of the signal under measurement that can be converted by the low-speed comparators 12. The low-speed comparators 12 can convert, into binary or multi-valued signals, a signal under measurement that has a larger amplitude than the maximum amplitude of the signal under measurement that can be converted by the high-speed comparator 14. In other words, the low-speed comparators 12 can handle low-speed and large-amplitude signals, and the high-speed comparator 14 can handle high-speed and small-amplitude signals.

The termination resistance 26 is arranged in parallel with the high-speed comparator 14 and has an impedance match with the high-speed transmission paths 18. The termination resistance 26 is connected at one end thereof to one of the inputs of the high-speed comparator 14 and at the other end thereof to the other of the inputs of the high-speed comparator 14. The termination resistance 26 is preferably positioned in the vicinity of the high-speed comparator 14. For example, the length of the transmission path between the termination resistance 26 and the high-speed comparator 14 may be shorter than the length of the high-speed transmission paths 18.

The switching sections 32 are configured to switch, according to a signal output from the device under test 200, whether the signal under measurement output from the device under test 200 is measured by the low-speed comparators 12 or the high-speed comparator 14. According to the present exemplary embodiment, the switching sections 32 are each positioned between the termination resistance 26 and the high-speed comparator 14. One of the switching sections 32 is positioned between one of the ends of the termination resistance 26 and one of the inputs of the high-speed comparator 14. The other of the switching sections 32 is positioned between the other of the ends of the termination resistance 26 and the other of the inputs of the high-speed comparator 14.

In the present exemplary embodiment, each of the switching sections 32 includes a switch that is turned off when the signal under measurement is measured by the low-speed comparators 12 and that is turned on when the signal under measurement is measured by the high-speed comparator 14. Stated differently, the switching sections 32 electrically isolate the input terminals of the high-speed comparator 14 and the termination resistance 26 from the input terminals of the low-speed comparators 12, when the signal under measurement is measured by the low-speed comparators 12.

The test apparatus 100 may judge whether the signal under measurement is either a high-speed-mode signal or a low-speed-mode signal, according to a signal output from the device under test 200. For example, when the device under test 200 is configured to output a mode signal indicative of the current mode of the device under test 200, the test apparatus 100 judges the mode of the device under test 200 based on the mode signal. Alternatively, the device under test 200 may output a signal that notifies the test apparatus 100 of a future mode transition in advance.

Alternatively, the test apparatus 100 may also judge whether a mode transition may occur in the device under test 200 by detecting a change in the frequency of the signal under measurement. The test apparatus 100 may further include a measuring section that is configured to measure the change in the frequency of the signal under measurement. As a further alternative example, the test apparatus 100 may judge whether a mode transition may occur in the device under test 200 by detecting a change in the amplitude of the signal under measurement. Each of the switching sections 32 is turned on when the device under test 200 outputs a high-speed-mode signal under measurement and turned off when the device under test 200 outputs a low-speed-mode signal under measurement.

In the above-described manner, while the termination resistance 26 is arranged in the vicinity of the high-speed comparator 14, the termination resistance 26 can be isolated from the low-speed comparators 12 when the device under test 200 is in the low-speed mode. In addition, since the switching sections 32 are dynamically controlled while the test apparatus 100 is receiving the signal under measurement, the test apparatus 100 can measure the signal under measurement that can dynamically switch between the low-speed mode and the high-speed mode.

In the case of the measuring section 10 shown in FIG. 2, however, an open stub may be formed between the high-speed transmission paths 18 and the switching sections 32 if the switching sections 32 are turned off. In addition, since the termination resistance 26 and the high-speed comparator 14 are connected to each other via the switching sections 32, it may be made difficult to position the termination resistance 26 in the vicinity of the high-speed comparator 14.

Figure 3:
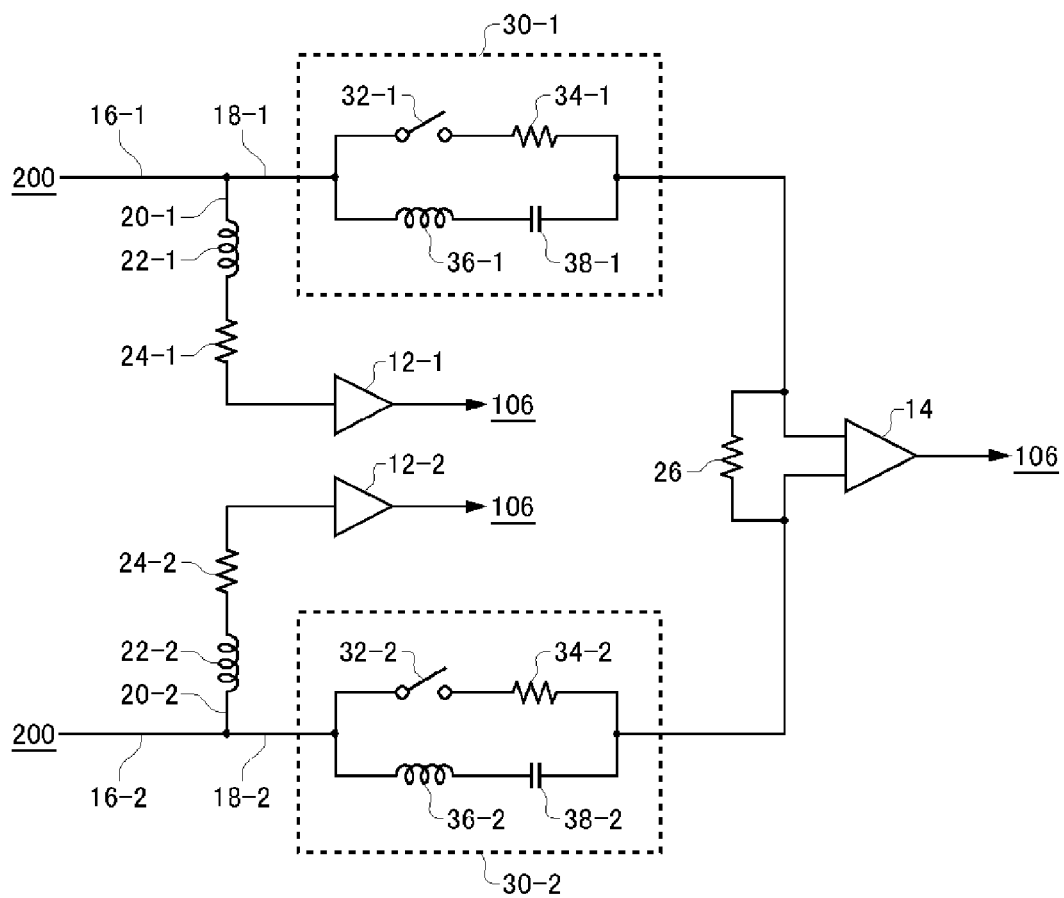
FIG. 3 illustrates another exemplary configuration of the measuring section 10.

FIG. 3 illustrates another exemplary configuration of the measuring section 10. According to the present exemplary embodiment, the measuring section 10 includes equalizer circuits 30 on the respective high-speed transmission paths 18. The switching sections 32 are arranged within the equalizer circuits 30. According to the present exemplary embodiment, the high-speed transmission paths 18 are configured to transmit the signal under measurement to the high-speed comparator 14 and the termination resistance 26. Except for these configurations, the measuring section 10 shown in FIG. 3 has the same configuration as the measuring section 10 shown in FIG. 2.

According to the present exemplary embodiment, the switching sections 32 are arranged on the high-speed transmission paths 18 and are turned off when the signal under measurement is measured by the low-speed comparators 12. Thus, the switching sections 32 can electrically isolate the input terminals of the high-speed comparator 14 and the termination resistance 26 from the input terminals of the low-speed comparators 12 when the signal under measurement is measured by the low-speed comparators 12. In the present exemplary embodiment, the expression "electrically isolating" indicates that the signal under measurement is not transmitted to the high-speed comparator 14 and the termination resistance 26 while the device under test 200 is in the low-speed mode.

To sum up, in the present exemplary embodiment, as long as the low-speed-mode signal under measurement is blocked from being input into the high-speed comparator 14 and the termination resistance 26, the input terminals of the high-speed comparator 14 and the termination resistance 26 are considered to be electrically isolated from the input terminals of the low-speed comparators 12 even if it is possible to transmit a signal having a higher frequency to the high-speed comparator 14 and the termination resistance 26.

The equalizer circuits 30 according to the present exemplary embodiment each include a resistance component 34, an inductance component 36, and a capacitance component 38. In each equalizer circuit 30, the values of the respective components are coordinated to compensate for the attenuation, distortion and the like of the signal that may occur in the transmission path from the device under test 200 to the high-speed comparator 14.

The switching sections 32 according to the present exemplary embodiment are provided in series with the resistance components 34 of the equalizer circuits 30. Thus, the on resistances of the switching sections 32 can be used as the resistance components of the equalizer circuits 30. Accordingly, the resistance values of the resistance components 34 are adjusted according to the on resistances of the switching sections 32. The resistance components 34 may include variable resistors with variable resistance values. The equalizer circuits 30 may adjust the resistance values of the variable resistors depending on the changes over time in the on resistances of the switching sections 32.

The capacitance components 38 and the inductance components 36 of the present exemplary embodiment are arranged in parallel with the resistance components 34 and the switching sections 32. In this way, while the switching sections 32 are turned on, the equalizer circuits 30 serve as equalizers. On the other hand, while the switching sections 32 are turned off, the equalizer circuits 30 serve as high-pass filters. Thus, when the low-speed comparators 12 are used to measure the signal under measurement, the switching sections 32 can electrically isolate the input terminals of the high-speed comparators 14 and the termination resistance 26 from the input terminals of the low-speed comparators 12.

Here, the cutoff frequency of the high-pass filters is preferably higher than the frequency (or the data transfer rate) of the signal under measurement output while the device under test 200 is in the low-speed mode and lower than the frequency (or the data transfer rate) of the signal under measurement output while the device under test 200 is in the high-speed mode. The data transfer rate of the signal under measurement output while the device under test 200 is in the low-speed mode is, for example, 10 Mbps, and the data transfer rate of the signal under measurement output while the device under test 200 is in the high-speed mode is, for example, 3 Gbps.

According to the above-described configuration, an open stub is not formed even if the switching sections 32 are turned off. In addition, since the termination resistance 26 can be connected to the high-speed comparator 14 without having the switching sections 32 provided therebetween, the termination resistance 26 can be positioned in the close vicinity of the high-speed comparator 14 and the influence of the signal reflection can be reduced.

In the present exemplary embodiment, the switching sections 32 may be MOS analog switches. The use of the MOS analog switches enables high-speed switching. Although the MOS analog switches have a relatively high on resistance on the order of several ohms, the on resistances of the MOS analog switches can be used efficiently as the resistance components of the equalizer circuits 30.

Figure 4:
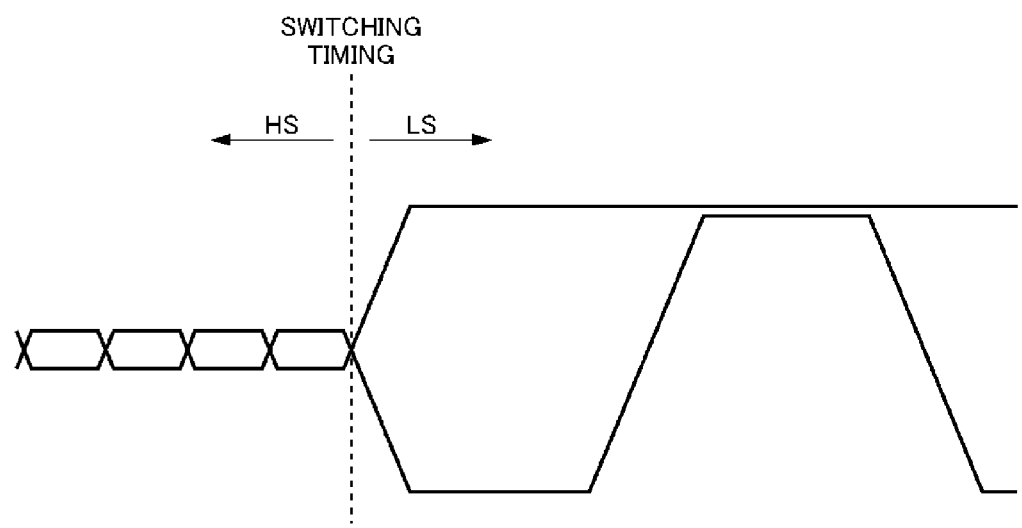
FIG. 4 illustrates an exemplary waveform of a signal under measurement.

FIG. 4 illustrates an exemplary waveform of the signal under measurement. In FIG. 4, the horizontal axis represents the time and the vertical axis represents the signal level. According to the present exemplary embodiment, the signal under measurement switches from the high-speed mode (HS) to the low-speed mode (LS) at a switching timing. As shown in FIG. 4, the signal under measurement is a differential signal during the high-speed mode (HS) and two single-ended signals during the low-speed mode (LS).

The test apparatus 100 switches the switching sections 32 from the turned-on state to the turned-off state at the switching timing. When the signal under measurement switches from the low-speed mode (LS) to the high-speed mode (HS), the test apparatus 100 switches the switching sections 32 from the turned-off state to the turned-on state. As described above, the test apparatus 100 detects the switching timing by referring to a signal output from the device under test 200. In this way, the test apparatus 100 can measure the signal under measurement of FIG. 4 whose mode dynamically switches.

Figure 5:
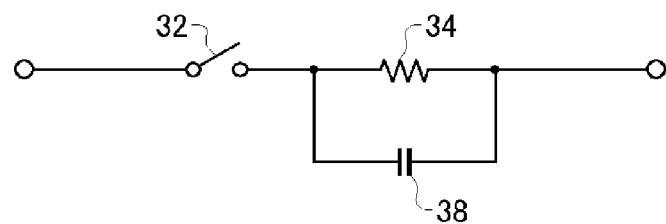
FIG. 5 illustrates another exemplary configuration of an equalizer circuit 30.

FIG. 5 shows another exemplary configuration of the equalizer circuits 30. In the present exemplary embodiment, the equalizer circuits 30 each include the switching section 32, the resistance component 34 and the capacitance component 38. The resistance component 34 and the capacitance component 38 are arranged in parallel with each other between the common transmission path 16 and the high-speed comparator 14. The switching section 32 is arranged in series with each of the resistance component 34 and the capacitance component 38 between the common transmission path 16 and the high-speed comparator 14. In the present exemplary embodiment, the on resistance of the switching section 32 is also used as the resistance component of the equalizer circuit 30.

Figure 6:
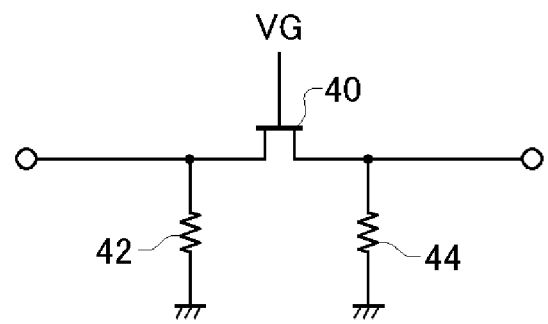
FIG. 6 illustrates an exemplary configuration of a switching section 32 shown in FIGS. 2 to 5.

FIG. 6 illustrates an exemplary configuration of the switching sections 32 shown in FIGS. 2 to 5. In the present exemplary embodiment, the switching sections 32 each include a semiconductor switch 40 a resistor 42, and a resistor 44. The semiconductor switch 40 is, for example, a MOS analog switch. The source and drain of the semiconductor switch 40 are arranged on the high-speed transmission path 18. The respective ends (the source and the drain) of the semiconductor switch 40 are connected to a reference potential through the resistors 42 and 44. In the present exemplary embodiment, the reference potential is the ground potential. In this way, the switching sections 32 can also serve as attenuators.

Furthermore, the test apparatus 100 may control the voltage VG applied to the gate of the semiconductor switch 40 according to the temperature of the equalizer circuit 30 or semiconductor switch 40. For example, the test apparatus 100 controls the voltage VG in a manner to compensate for a change in on resistance of the semiconductor switch 40 that may be caused by a change in the temperature of the semiconductor switch 40. The test apparatus 100 may apply different voltages to the gates of the two semiconductor switches 40 in order to compensate for a difference in characteristics between the respective semiconductor switches 40 that may result from variation in fabrication.

Figure 7:
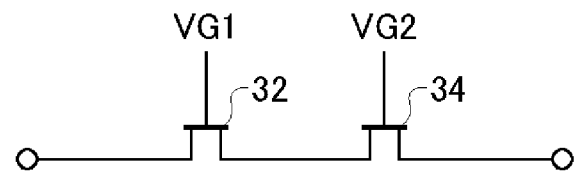
FIG. 7 illustrates an exemplary configuration of a switching section 32 and a resistance component 34.

FIG. 7 illustrates an exemplary configuration of the switching section 32 and the resistance component 34. According to the present exemplary embodiment, the switching section 32 and the resistance component 34 are both semiconductor switches. The semiconductor switch constituting the resistance component 34 may be controlled to be in the same on or off state as the semiconductor switch constituting the switching section 32. The semiconductor switch constituting the resistance component 34 may be controlled to be remain in the on state during the test of the device under test 200. The on resistance of this semiconductor switch is used as the resistance component 34.

The test apparatus 100 may control the voltages VG1 and VG2 applied to the gates of the respective semiconductor switches according to the temperatures of the semiconductor switches or equalizer circuit 30. The test apparatus 100 may include resistances to connect the respective ends of each of the semiconductor switches to a reference potential. The test apparatus 100 may control the gate voltage VG2 of the semiconductor switch constituting the resistance component 34 according to the temperature and other parameters, and may not change the gate voltage VG1 of the semiconductor switch constituting the switching section 32 according to the temperature and other parameters.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a device under test, comprising:
    a low-speed comparator;
    a high-speed comparator that is operable faster than the low-speed comparator; and
    a switching section that switches, according to a signal output from the device under test, which one of the low-speed comparator and the high-speed comparator is used to measure a signal under measurement output from the device under test;
    wherein the high-speed comparator is operable to convert, into a binary or multi-valued signal, a signal under measurement that has a higher frequency than a maximum frequency of a signal under measurement that be converted by the low-speed comparator; and
    wherein the low-speed comparator is operable to convert, into a binary or multi-valued signal, a signal under measurement that has a larger amplitude than a maximum amplitude of a signal under measurement that be converted by the high-speed comparator.

2. The test apparatus as set forth in claim 1, further comprising
    a termination resistance that is arranged in parallel with the high-speed comparator, wherein
    the switching section electrically isolates an input terminal of the high-speed comparator and the termination resistance from an input terminal of the low-speed comparator, when the low-speed comparator is used to measure the signal under measurement.

3. The test apparatus as set forth in claim 2, further comprising:
    a common transmission path that transmits the signal under measurement;
    a low-speed transmission path that transmits the signal under measurement that has been transmitted through the common transmission path, to the low-speed comparator; and
    a high-speed transmission path that transmits the signal under measurement that has been transmitted through the common transmission path, to the high-speed comparator and the termination resistance, wherein
    the switching section includes a switch that is provided on the high-speed transmission path and that is turned off when the low-speed comparator is used to measure the signal under measurement.

4. The test apparatus as set forth in claim 3, further comprising
    an equalizer circuit that is provided on the high-speed transmission path and that includes a resistance component, wherein
    the switch is arranged in series with the resistance component.

5. The test apparatus as set forth in claim 4, wherein
    the switch is a semiconductor switch, and
    the test apparatus controls a voltage applied to a gate of the switch according to a temperature of the switch or the equalizer circuit.

6. The test apparatus as set forth in claim 4, wherein
    the equalizer circuit further includes a capacitance component that is arranged in parallel with the resistance component, and
    the switch is arranged in series with the capacitance component.

7. The test apparatus as set forth in claim 4, wherein
    the equalizer circuit further includes a capacitance component that is arranged in parallel with the resistance component, and
    the switch is arranged in parallel with the capacitance component.

8. The test apparatus as set forth in claim 4, further comprising resistances that connect respective ends of the switch to a reference potential.

* * * * *